(12) United States Patent
Walker et al.

(10) Patent No.: US 8,982,661 B2
(45) Date of Patent: Mar. 17, 2015

(54) FLEXIBLE IDENTIFICATION TECHNIQUE

(71) Applicant: Intel Corporation, Santa Clara, CA (US)

(72) Inventors: Julie M. Walker, El Dorado Hills, CA (US); Doyle Rivers, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 13/910,632

(22) Filed: Jun. 5, 2013

(65) Prior Publication Data
US 2014/0362657 A1    Dec. 11, 2014

(51) Int. Cl.
*G11C 8/00* (2006.01)
*G11C 8/04* (2006.01)
*G11C 5/14* (2006.01)
*G11C 8/06* (2006.01)

(52) U.S. Cl.
CPC .. *G11C 8/04* (2013.01); *G11C 5/14* (2013.01); *G11C 8/06* (2013.01)
USPC ..................................... 365/230.08; 365/226

(58) Field of Classification Search
None
See application file for complete search history.

(56) References Cited

U.S. PATENT DOCUMENTS 8,094,511 B2 *   1/2012   Lee et al. ..................... 365/221

* cited by examiner

*Primary Examiner* — Kretelia Graham
(74) *Attorney, Agent, or Firm* — Alpine Technology Law Group LLC

(57) ABSTRACT

A shared-signaling multi-device memory system is capable of changing between addressing modes without the multi-device memory being required to undergo a power cycle. First and second registers of a memory device are set to both contain first address-identification information in response a first address-assignment command that is received a power cycle. The first register is set to contain second address-identification information in response a second address-assignment command that is received subsequently to the first address assignment command. Depending on the value of the second address-identification information, the memory device is configured in an individual-device-addressing mode or a parallel addressing mode without a power cycle. The first register can be reset to the first address-identification information contained in the second register in response to an address-restore command without a power cycle. A corresponding method is also disclosed.

20 Claims, 3 Drawing Sheets

FLEXIBLE IDENTIFICATION TECHNIQUE

TECHNICAL FIELD

Embodiments of systems and techniques described herein relate to memory devices. More particularly, embodiments of techniques and systems relate to multi-device cross-point memory systems that utilize shared signaling, such as, but not limited to, multi-device memories.

BACKGROUND

A conventional multi-device cross-point memory system that utilizes shared signaling, such as a multi-device memory, is required to incur a power cycle and the accompanying overhead if memory identifications of one or more of the individual memory devices of the system are to be modified. Such a memory identification modification can occur, for example, during a change between an individual-memory-addressing mode and a global-addressing mode, from a global-addressing mode to an individual-memory-addressing mode, and if one or more of the individual memory devices are to be masked from a global operation.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
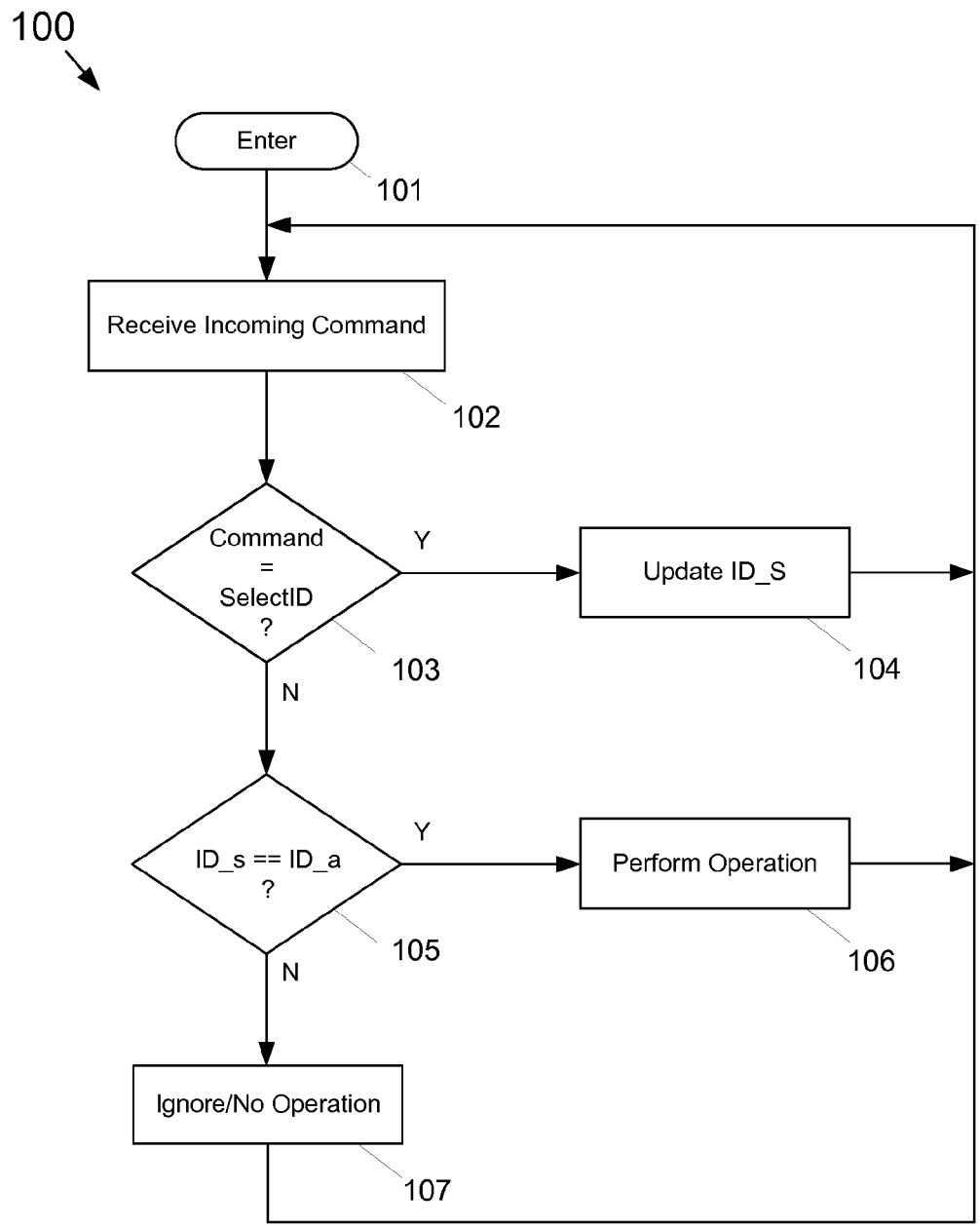
FIG. 1 is a flow diagram depicting an exemplary logic process of an individual conventionally configured cross-point memory that utilizes an ID_a value to respond to received commands.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to semiconductor memories and, more particularly, to multi-device cross-point memory systems that utilize shared signaling, such as, but not limited to, multi-device NAND memories. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein provide a multi-device cross-point memory with the ability switch between an addressing mode in which individual memory devices of the system are addressed by a system controller and an addressing mode in which two or more individual memory devices of the system can be addressed in parallel without incurring a power cycle and the accompanying overhead of such a power cycle. As used herein, the term "power cycle" should be understood to mean any event in which the contents of volatile latches that hold values that control functionality of a device are lost. Exemplary power cycles include, but are not limited to, a full power down and power up event. Embodiments of the subject matter disclosed herein also provide the ability for one or more memory devices of a multi-device memory system to be masked from global commands received from the system controller without a power cycle.

By permitting changes between an individual-device-addressing mode and a parallel-addressing mode without an intervening power cycle, embodiments of the subject matter disclosed herein provide a faster modulated fail behavior in a debug, validation, and/or failure analysis setting in comparison to a conventionally configured signal-sharing multi-device memory system. Modifications to volatile configuration registers can also be easily made on a per-device (per-die) basis within a system that is configured for a parallel-addressing mode in order to demonstrate quality and/or reliability improvement during development. Moreover, outdated system configurations can be reconfigured, thereby extending the life and/or by enabling flexibility in the architectural design of a signal-sharing multi-device memory system.

When it is operationally necessary for a conventionally configured shared-signaling multi-device memory to switch between an individual-addressing mode in which the different device memories are individually addressed to a parallel-addressing mode (i.e., global addressing), a power cycle must occur to implement the change between the different addressing modes. That is, a conventionally configured signal-sharing multi-device system sets an ID_a value for each cross-point memory device after a power cycle so that the system controller is able to address which device(s) is/are being targeted for an operation. An ID_a value comprises an ID value that is stored by an individual cross-point memory device and that is set by an AssignID command. After a power cycle, an AssignID command, for example, is sequentially issued by the system controller to set the ID_a value for each cross-point memory device. After the ID_a value has been set, subsequent AssignID commands are ignored by a cross-point memory device, and the ID_a value cannot be changed without another power cycle. To target a device for an operation, the system controller issues a SelectID command with the ID_s set equal to the ID_a value of the targeted device(s) so that the targeted device(s) is (are) enabled to respond to subsequent command(s). The ID_s, which is the ID value held by a memory device and is set by the SelectID command, is used to enable a targeted device to respond to subsequent commands.

Consider, for example, a situation in which the previously described conventionally configured multi-device system is in a parallel-addressing mode and in which continued operation customer and/or testmode register values within one or more of the individual memory devices are to be modified on a per-device (per-die) basis. Conventionally, this situation would require changing the ID scheme from a parallel-addressing mode (parallel-ID) scheme to a mode that supports individual die access for changing the register values, then back to the parallel-addressing mode. In this situation, however, customer and/or testmode register values might be stored in volatile latches, and any modifications to the volatile latches in either ID scheme might not persist across the conventionally required power cycle(s).

Another situation in which a power cycle would conventionally be necessary to change between addressing modes is if one or more devices in a shared-signaling system are to be "masked" or isolated from any level of use, such as in a situation of a die failure or if a spare and/or redundant device is added to the system. For die failure, a system would be able to adjust the addressing mode without a power cycle so that a "bad" device is operationally replaced by a spare/redundant device and/or excluded from continued operation. For addition of a spare and/or redundant device, the spare and/or redundant device may be masked from unnecessary operations to provide energy savings, etc., until the device is needed.

FIG. 1 is a flow diagram 100 depicting an exemplary logic process of an individual conventionally configured cross-point memory that utilizes an ID_a value to respond to received commands. The process is entered at 101. At 102, a command is received. At 103, it is determined whether the received command is a SelectID command. If so, flow continues to 104 wherein the ID_s is updated for the memory device with the value indicated by the SelectID command. Flow then returns to 102. If, at 103, it is determined that the received command is not a SelectID command, flow continues to 105 where it is determined whether the ID_s of the command equals the ID_a value of the memory device. If so, flow continues to 106 where the operation of the received command is performed. Flow returns to 102. If, at 105, it is determined that the ID_s of the command does not equal the ID_a value of the memory device, flow continues to 107 where the command is ignored and no operation is performed. Flow returns to 102.

The requirement that a signal-sharing multi-device memory system incur a power cycle and the accompanying overhead of a power cycle is eliminated by embodiments of the subject matter disclosed herein. That is, embodiments of the subject matter disclosed herein provide a multi-device cross-point memory the ability to switch between an addressing mode in which individual memory devices of the system are addressed by a system controller and an addressing mode in which two or more individual memory devices of the system can be addressed in parallel without undergoing a power cycle. Additionally, embodiments of the subject matter disclosed herein provide the ability for one or more memory devices of a multi-device memory to be masked from global commands received from the system controller without a power cycle.

Embodiments of the subject matter disclosed herein comprise a cross-point memory device that utilizes an ID_a_init value as a persistent default addressing-identification (ID) value that is stored by a memory device. The value of ID_a_init is assigned to ID_a at initialization (i.e., power on) by the first AssignID command received by the memory device. That is, the ID_a_init value is set in conjunction with the ID_a value in response to the first received AssignID command. Alternatively, the ID_a_init value may also be loaded by reading from persistent addressing-identification values stored within the device, such as, but not limited to, loaded from poly-fuses, metal fuses, memory array cells, etc. In one exemplary embodiment, the ID_a_init value may be stored in one or more latches contained within a memory device.

After the assignment of ID_a and ID_a_init addressing-identification values at device initialization, the device logic permits the value of ID_a to be changed to any value and for the memory device to respond to commands whenever ID_s is equal to ID_a. As used herein, the terms "command" or "commands" should be understood to mean any sequence of signaling understood by an interface of a device to accomplish an ID_a value update or restore. If the system controller needs to restore the value of ID_a to its initially assigned value (i.e., the default ID_a_init value), the system controller issues a RestoreID command that causes the current value of ID_a to be changed to the ID_a_init value.

Figure 2:
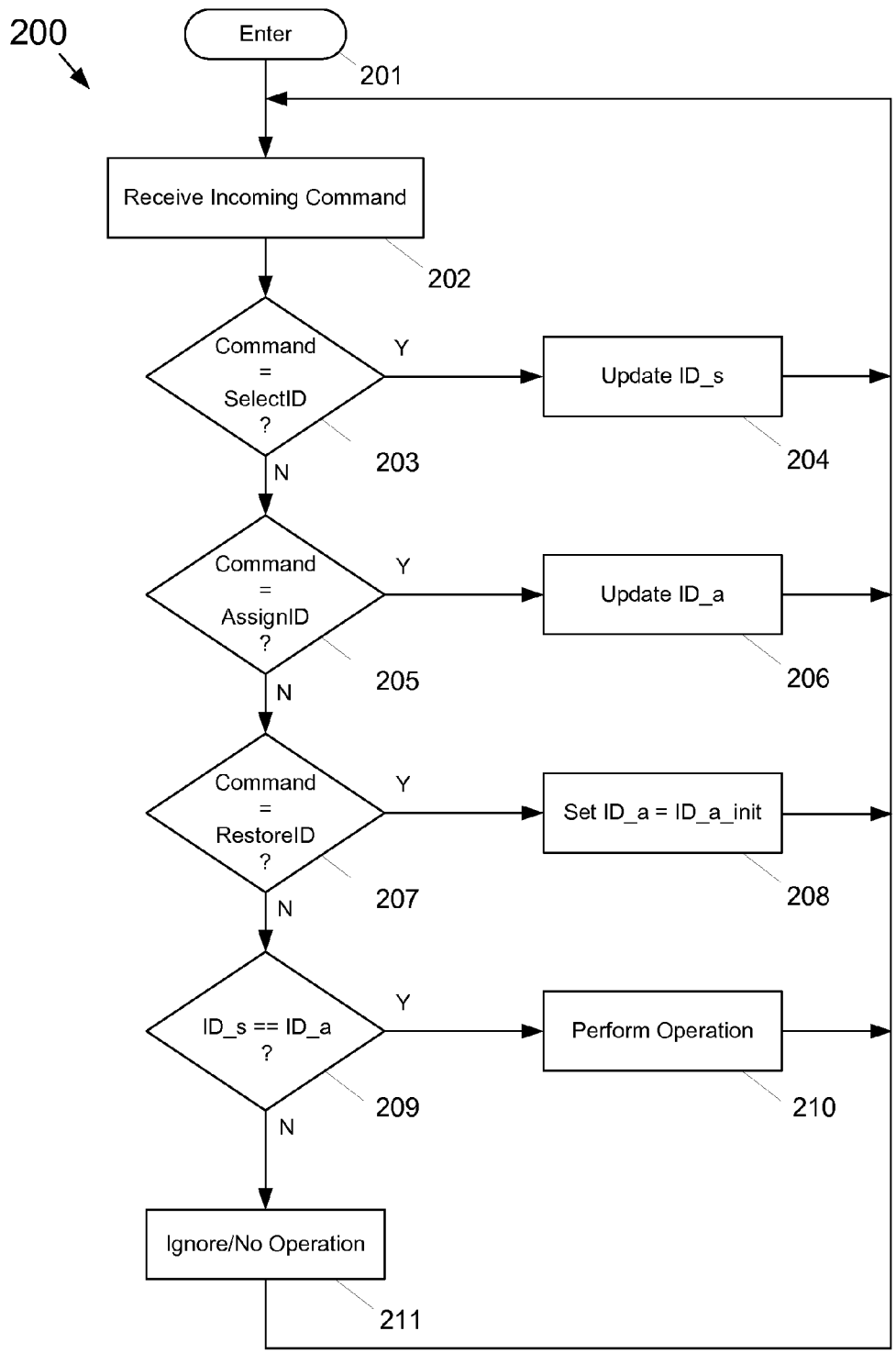
FIG. 2 is a flow diagram depicting an exemplary logic process of an individual cross-point memory that utilizes an ID_a_init value to respond to received commands according to the subject matter disclosed herein.

FIG. 2 is a flow diagram 200 depicting an exemplary logic process of an individual cross-point memory that utilizes an ID_a_init value to respond to received commands according to the subject matter disclosed herein. The process is entered at 201 with the memory device having the ID_a and ID_a_init already set to the same addressing-identification value by the first received AssignID command. At 202, a command is received. At 203, it is determined whether the received command is a SelectID command. If so, flow continues to 204 wherein the ID_s is updated for the device with the addressing-identification value indicated by the SelectID command. Flow then returns to 202. If, at 203, it is determined that the received command is not a SelectID command, flow continues to 205 wherein it is determined whether the received command is an AssignID command. If so, flow continues to 206 where ID_a is updated for the device with the addressing-identification value indicated by the AssignID command. Flow returns to 202. If, at 205, it is determined that the received command is not an AssignID, flow continues to 207 where it is determined whether the received command is a RestoreID command. If so, flow continues to 208 where the value of ID_a is set to the addressing-identification value of ID_a_init. Flow returns to 202. If, at 207, it is determined that the received command is not a RestoreID command, flow continues to 209 where it is determined whether the ID_s of the command equals the ID_a of the memory device. If so, flow continues to 210 where the operation of the command is performed. Flow returns to 202. If, at 209, it is determined that the ID_s of the command does not equal the ID_a of the memory device, flow continues to 211 where the command is ignored and no operation is performed. Flow returns to 202. It should be understood that an ID_a reassignment via an AssignID command or a RestoreID command may occur at any point during operation of the system, and without incurring a power cycle.

Figure 3A:
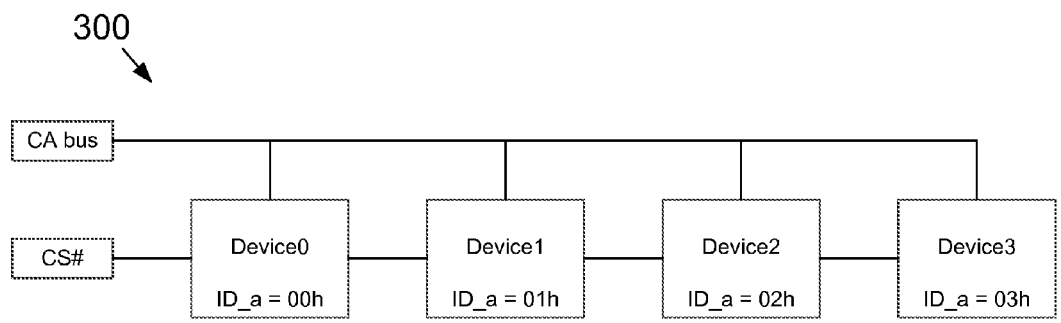
FIGS. 3A-3C depict an exemplary shared-signaling four memory-device system in various system-addressing mode configurations according to the subject matter disclosed herein.

To illustrate the subject matter disclosed herein, consider a shared-signaling multi-device memory system comprising four cross-point memory devices that share a CS# and Command/Address (CA) bus. Consider also that the ID_a_init for each of the four memory devices has been initially configured for an individual-address mode in response to the first AssignID command received. FIG. 3A depicts an exemplary shared-signaling four memory-device system 300 in which registers containing the ID_a values for each of the four memories Device0-Device3 have been respectively set to 00h-03h. Devices Device0-Device3 can be targeted individually by the system controller because the system is configured for an individual-device-addressing mode.

Figure 3B:
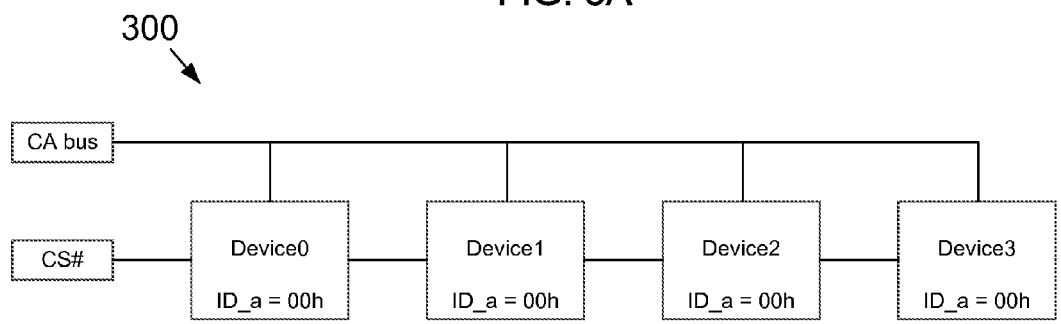

Now, consider a situation in which the normal system operation of the system necessitates change to parallel-addressing mode. Using the exemplary operational logic depicted in FIG. 2 (blocks 205 and 206), an AssignID command is used to set the ID_a values for each of the memory devices Device0-Device3 to, for example, 00h, so that all four memory devices can be targeted in parallel. FIG. 3B depicts the exemplary four memory-device system 300 in which registers containing the ID_a value for each of the four memories Device0-Device3 has been set to 00h so that memories Device0-Device3 can be targeted in parallel. A power cycle is not needed to change to the parallel-addressing mode.

To restore the addressing mode back to an individual-device-addressing mode, a RestoreID command is used (FIG. 2, blocks 207 and 208)), and all memory devices will again have a different ID_a value based on their respective persistent ID_a_init value (i.e., FIG. 3A). Each persistent ID_a_init value is used to overwrite the ID_a value of the device in response to a RestoreID command. A power cycle is not needed to change back to the individual-addressing mode.

Figure 3C:
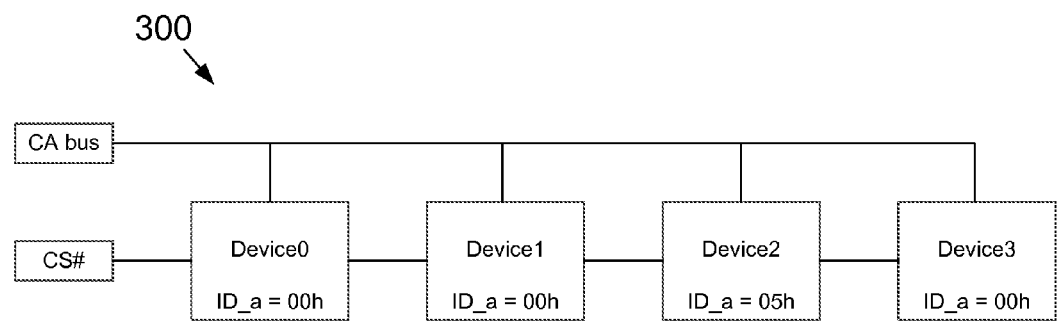

In a situation in which a parallel-addressing mode is configured (i.e., FIG. 3B) and a customer and/or testmode register for one or more devices are to be modified on a per-die basis, the system sets the ID_s=ID_a of a memory device using the SelectID command for each device that is to be targeted. FIG. 3C depicts the exemplary four memory-device system 300 in which the register containing the ID_a value for memory Device2 has been set to, for example, 05h so that the customer and/or testmode register values of memory Device2 can be modified as needed. As soon as the operation is complete that necessitated the modification of the customer and/or testmode register(s), the system can return to the parallel-addressing mode operation by reassign ID_a values to 0x00 (FIG. 3B) using the sequence depicted in FIG. 2.

In a situation in which a parallel-addressing mode is configured and any of the ID_a values of the memory devices need to be modified to, for example, mask one or more memory devices from a given operation, the system uses the sequence shown in FIG. 2 and the ID_a value for the one or more memory devices that are to be masked is set using the SelectID with a value other than 0x00. For this situation, FIG. 3C depicts the exemplary four memory-device system 300 in which the ID_a value for memory Device2 has been set to, for example, 05h so that memory Device2 is excluded from operation(s) if ID_s=0x00. The masked device may be re-included in subsequent parallel-addressing operations by using the SelectID command (FIG. 2) and setting the ID_a value for the device to equal 0x00 (FIG. 5B).

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A method, comprising:
setting a first register and a second register in at least one memory device of a shared-signaling multi-device memory to both contain first address-identification information for the at least one memory device in response a first received address-assignment command, the first address-assignment command being the first address-assignment command received after a power cycle for the multi-device memory, and the first address-identification information being available from a non-volatile register of the at least one memory device;
setting the first register to contain second address-identification information for the at least one memory in response to receiving a second address-assignment command, the second address-assignment command being received subsequently to the first address assignment command without the multi-device memory undergoing a power cycle;
setting the first register to contain the first address-identification information contained in the second register in response to receiving an address-restore command without the multi-device memory undergoing a power cycle.

2. The method according to claim 1, wherein setting the first register to contain second address-identification information configures the at least one memory device for a parallel-addressing mode.

3. The method according to claim 2, further comprising setting the first register in the at least one memory device to contain third address-identification information for the at least one memory in response to receiving a third address-assignment command, the third address-assignment command being received subsequently to the second address assignment command,
wherein setting the first register to contain the third address-identification information configures the at least one memory device for an individual-device-addressing mode.

4. The method according to claim 1, wherein setting the first register to contain second address-identification information configures the at least one memory device for an individual-device-addressing mode.

5. The method according to claim 4, further comprising setting the first register to contain third address-identification information for the at least one memory device in response to receiving a third address-assignment command, the third address-assignment command being received subsequently to the second address assignment command,
wherein the setting the first register to contain third address-identification information configures the at least one memory device for a parallel-addressing mode.

6. The method according to claim 1, wherein setting the first register to contain second address-identification information configures the at least one memory device to be masked from subsequently received commands.

7. The method according to claim 6, further comprising setting the first register to contain third address-identification information for the at least one memory in response to the at least one memory device receiving a third address-assignment command, the third address-assignment command being received subsequently to the second address assignment command, wherein setting the first register to contain the third address-identification information configures the at least one memory device to be responsive to commands received subsequent to the third address-assignment command.

8. The method according to claim 1, wherein the multi-device memory comprises at least part of a solid-state drive.

9. An apparatus, comprising:
at least one memory device of a shared-signaling multi-device memory comprising first and second registers; and
an input/output device capable of receiving commands from a system controller of the multi-device memory, the at least one memory device being further configured to:
set the first register and the second register to both store first address-identification information for the at least one memory device in response to a first address-assignment command received by the input/output device, the first address-assignment command being the first address-assignment command received by the input/output device after a power cycle for the multi-device memory, and the first address-identification information being available from a non-volatile register of the at least one memory device;
set the first register to contain second address-identification information in response to the input/output device receiving a second address-assignment command, the second address-assignment command being received subsequently to the first address assignment command without a power cycle of the multi-device memory;
set the first register to contain the first address-identification information contained in the second register in response to receiving an address-restore command by the input/output device without a power cycle of the multi-device memory.

10. The apparatus according to claim 9, wherein the at least one memory device is configured for a parallel-addressing mode by the first register being set to contain second address-identification information.

11. The apparatus according to claim 10, wherein the at least one memory device is further configured to:
set the first register to contain third address-identification information in response to the input/output device receiving a third address-assignment command that is received subsequently to the second address assignment command,
wherein setting the first register to contain third address-identification information configures the at least one memory device for an individual-device-addressing mode.

12. The apparatus according to claim 9, wherein the at least one memory device is configured for an individual-device-addressing mode by the first register being set to contain second address-identification information.

13. The apparatus according to claim 12, wherein the at least one memory device is further configured to:
set the first register to contain third address-identification information in response to receiving a third address-assignment command that is received subsequently to the second address assignment command,
wherein setting the first register to contain third address-identification information configures the at least one memory device for a parallel-addressing mode.

14. The apparatus according to claim 9, wherein the at least one memory device is configured to be masked from subsequently received commands by the first register being set to contain second address-identification information.

15. The apparatus according to claim 9, wherein the multi-device memory comprises part of a solid-state drive.

16. A shared-signaling multi-device memory, comprising:
a plurality of memory devices, at least one memory device of the plurality of memory devices comprising:
an input/output device capable of receiving commands from a system controller of the multi-device memory, and
first and second registers, the first register and the second register capable of being set to both store first address-identification information for the at least one memory device in response a first address-assignment command received by the input/output device, the first address-assignment command being the first address-assignment command received after a power cycle for the multi-device memory, the first register being capable of being set to contain second address-identification information in response to the input/output device receiving a second address-assignment command without a power cycle, the second address-assignment command being received subsequently to the first address assignment command, and the first register further being capable of being set to contain the first address-identification information contained in the second register in response to input/output device receiving an address-restore command without a power cycle of the multi-device memory.

17. The apparatus according to claim 16, wherein the at least one memory device is configured for a parallel-addressing mode by the first register being set to contain second address-identification information.

18. The apparatus according to claim 16, wherein the at least one memory device is configured for an individual-device-addressing mode by the first register being set to contain second address-identification information.

19. The apparatus according to claim 16, wherein the at least one memory device is configured to be masked from subsequently received commands by the input/output device by the first register being set to contain second address-identification information.

20. The apparatus according to claim 16, wherein the multi-device memory comprises part of a solid-state drive.

* * * * *